(12) United States Patent
Krantz (10) Patent No.: US 10,345,055 B2
(45) Date of Patent: Jul. 9, 2019

(54) HEAT-DISSIPATING COOLING PAD

(71) Applicant: Karl Krantz, Hialeah, FL (US)

(72) Inventor: Karl Krantz, Hialeah, FL (US)

( * ) Notice: Subject to any disclaimer, the term of this patent is extended or adjusted under 35 U.S.C. 154(b) by 171 days.

(21) Appl. No.: 15/681,802

(22) Filed: Aug. 21, 2017

(65) Prior Publication Data

US 2019/0056185 A1    Feb. 21, 2019

(51) Int. Cl.
| | |
|---|---|
| *H05K 7/20* | (2006.01) |
| *H01L 23/373* | (2006.01) |
| *F28F 3/08* | (2006.01) |
| *F28F 21/04* | (2006.01) |
| *F28F 21/08* | (2006.01) |
| *F28F 3/12* | (2006.01) |
| *H01L 23/34* | (2006.01) |
| *H01L 23/367* | (2006.01) |
| *H05K 1/02* | (2006.01) |
| *F28D 21/00* | (2006.01) |

(52) U.S. Cl.
CPC .............. *F28F 21/04* (2013.01); *F28F 3/086* (2013.01); *F28F 3/12* (2013.01); *F28F 21/084* (2013.01); *F28F 21/085* (2013.01); *H01L 23/34* (2013.01); *H01L 23/367* (2013.01); *H05K 7/20409* (2013.01); *F28D 2021/0029* (2013.01); *H01L 23/373* (2013.01); *H01L 23/3736* (2013.01); *H05K 1/0203* (2013.01); *H05K 7/20509* (2013.01)

(58) Field of Classification Search
CPC ..... F28D 2021/0029; F28F 3/12; F28F 3/086; F28F 21/04; F28F 21/084; F28F 21/085; H01L 23/34; H01L 23/373; H01L 23/3736; H05K 7/20409; H05K 7/20509

USPC .......................... 165/168, 170, 185; 361/704
See application file for complete search history.

(56) References Cited

U.S. PATENT DOCUMENTS

| | | | |
|---|---|---|---|
| 5,771,789 A * | 6/1998 | Davis ................... | A23L 3/3418 126/21 A |
| 8,355,248 B2 | 1/2013 | Nishi | |
| 8,537,555 B2 | 9/2013 | Huang et al. | |
| 9,229,499 B2 | 1/2016 | Kirkpatrick | |
| 9,274,554 B2 | 3/2016 | Wong | |
| 9,303,928 B2 * | 4/2016 | Yang ..................... | H01L 23/373 |
| 9,636,166 B2 * | 5/2017 | Kerr ................... | A61B 18/1445 |
| 2006/0005548 A1 * | 1/2006 | Ruckstuhl .............. | A47B 77/08 62/3.2 |

(Continued)

FOREIGN PATENT DOCUMENTS

| | | |
|---|---|---|
| DE | WO2009157008 A1 | 12/2009 |
| JP | 2001177279 A * | 6/2001 |

*Primary Examiner* — Leonard R Leo
(74) *Attorney, Agent, or Firm* — Glenn E. Gold, P.A.; Glenn E. Gold (57) ABSTRACT

A heat-dissipating cooling pad includes a top layer of stone material, a bottom layer of stone material, an inner layer of copper material embedded within an inner cavity defined in an annular-shaped middle portion of the bottom layer of stone material, and an annular-shaped outer layer of aluminum material embedded within an annular-shaped outer cavity defined in an annular-shaped outer portion of the bottom layer of stone material surrounding and spaced outwardly from the annular-shaped middle portion of the bottom layer of stone material. The top layer of stone material and the bottom layer of stone material are adhered to one another.

19 Claims, 6 Drawing Sheets

(56) References Cited

U.S. PATENT DOCUMENTS

| | | | |
|---|---|---|---|
| 2008/0053111 A1* | 3/2008 | Walker | A23L 3/36 |
| | | | 62/56 |
| 2008/0205002 A1* | 8/2008 | Chui | H01L 23/473 |
| | | | 361/699 |
| 2011/0114646 A1* | 5/2011 | Proskey | A47G 19/2227 |
| | | | 220/592.17 |
| 2014/0000844 A1 | 1/2014 | Chandaria | |
| 2014/0110083 A1 | 4/2014 | Cheng | |
| 2015/0034291 A1 | 2/2015 | Wong | |
| 2015/0036291 A1 | 2/2015 | Yuan | |
| 2016/0273843 A1* | 9/2016 | Wenzel | F28F 3/12 |
| 2017/0215643 A1* | 8/2017 | Beach | F25B 21/04 |

* cited by examiner

HEAT-DISSIPATING COOLING PAD

FIELD OF THE INVENTION

The present invention relates to dissipating heat from heat generating equipment, and more particularly, is concerned with a heat-dissipating cooling pad.

BACKGROUND OF THE INVENTION

Many electronic devices have been developed for use in numerous commercial fields, such as electronic communications and transportation, to name a few. These electronic devices have elements, defined as power components, mounted on circuit boards or incorporated in integrated circuits that are capable of generating heat when operating. The basic problem that has arisen from this development is that most of these power components of electronic devices over time have tended to become smaller in size and, as a consequence, generate more heat.

Conventional approaches found in the prior art toward solving this basic problem have been explored in the past. For example, one past approach has been to provide a heat-dissipating device comprising of a casing for use in conjunction with a communications apparatus having heat generating power elements. The heat-dissipating casing employs a plurality of cooling fins, alone or in combination with a heat pipe, either directly attached to the bottom of the casing or incorporated as an integral part of the casing. However, such implementation of a heat-dissipating device appears to fail in significantly reducing the temperature of the devices it is coupled with. Not to mention its application is limited and not compatible in certain areas such as the automotive and marine area.

Therefore, there is a long felt, but as of yet unmet, need for a more effective, easy to employ heat-dissipating cooling pad in the art that overcomes the deficiencies of the known art and the problems that remain unsolved.

SUMMARY OF THE INVENTION

The present invention is directed to an innovation that overcomes the deficiencies of the known art and the problems that remain unsolved by providing a heat-dissipating cooling pad that may be coupled with a wide variety of heat-generating electronic devices employed in numerous commercial fields, such as micro-processors, phones, tablets and laptops in electronic communications and cars, trucks, yachts and ships in transportation.

In one aspect of the present invention, a heat-dissipating cooling pad includes:
  a top layer of stone material;
  a bottom layer of stone material;
  an inner layer of copper material embedded within an inner cavity defined in an annular-shaped middle portion of the bottom layer of stone material; and
  an annular-shaped outer layer of aluminum material embedded within an annular-shaped outer cavity defined in an annular-shaped outer portion of the bottom layer of stone material surrounding and spaced outwardly from the annular-shaped middle portion of the bottom layer of stone material. The top layer of stone material and the bottom layer of stone material are adhered to one another.

In another aspect of the present invention, the top layer of stone material has a plurality of spaced apart channels that extend laterally through the top layer of stone material, are spaced from the top and bottom surfaces of the top layer of stone material, and are open at and extend between a pair of opposite sides of the continuous peripheral surface of the top layer of stone material.

In another aspect of the present invention, the bottom layer of stone material has a plurality of spaced apart channels that extend laterally through the bottom layer of stone material, are spaced from the top and bottom surfaces of the bottom layer of stone material, are open at and extend between a pair of opposite side portions of a continuous peripheral surface of the bottom layer of stone material, and are interrupted by the inner and annular-shaped outer cavities in the annular-shaped middle portion and annular-shaped outer portion of the bottom layer of stone material with the inner layer of copper material and the annular-shaped outer layer of aluminum material respectively embedded therein.

In another aspect of the present invention, the bottom layer of stone material has a plurality of spaced apart perforations that extend through the bottom layer of stone material between the bottom surface of the bottom layer of stone material and a bottom surface of the inner cavity of the bottom layer of stone material that is in contact with the lower surface of the inner layer of copper material.

In another aspect of the present invention, wherein the inner layer of embedded material within the inner cavity may be of a material selected from a group consisting of gold, silver, and aluminum.

In another aspect of the present invention, the stone material of the top and bottom layers is granite.

In another aspect of the present invention, a heat-dissipating cooling pad includes:
  a top layer of stone material having spaced apart top and bottom surfaces and a continuous peripheral surface that surrounds and extends between the spaced apart top and bottom surfaces of the top layer of stone material;
  a bottom layer of stone material having spaced apart top and bottom surfaces and a continuous peripheral surface that surrounds and extends between the spaced apart top and bottom surfaces of the bottom layer of stone material;
  an inner layer of copper material embedded within an inner cavity defined in an annular-shaped middle portion of the bottom layer of stone material, the inner layer of copper material having an upper surface that extends flush with the top surface of the bottom layer of stone material, a lower surface that is spaced apart from and displaced below the upper surface of the inner layer of copper material and above the bottom surface of the bottom layer of stone material, and a continuous peripheral surface that surrounds and extends between the spaced apart upper and lower surfaces of the inner layer of copper material; and
  an annular-shaped outer layer of aluminum material embedded within an annular-shaped outer cavity defined in an annular-shaped outer portion of the bottom layer of stone material that surrounds and is spaced outwardly from the middle portion of the bottom layer of stone material, the annular-shaped outer layer of aluminum material having an upper surface that extends flush with the top surface of the bottom layer of stone material and the upper surface of the inner layer of copper material, a lower surface that is spaced apart from and displaced below the upper surface of the annular-shaped outer layer of aluminum material and above the bottom surface of the bottom layer of stone material, and spaced apart inner and outer continuous peripheral surfaces that extend between the upper and lower surfaces thereof such that the inner continuous peripheral surface of the annular-shaped outer layer of aluminum material is spaced apart from the continuous peripheral surface of the inner layer of copper material by the annular-shaped middle portion of the bottom layer of stone material and the outer continuous peripheral surface of the annular-shaped outer layer of aluminum material is spaced apart from the continuous peripheral surface of the bottom layer of stone material by the annular-shaped outer portion of the bottom layer of stone material;

wherein the top layer of stone material has a plurality of spaced apart channels that extend laterally through the top layer of stone material, are spaced from the top and bottom surfaces of the top layer of stone material, and are open at and extend between a pair of opposite sides of the continuous peripheral surface of the top layer of stone material;

wherein the bottom layer of stone material has a plurality of spaced apart channels that extend laterally through the bottom layer of stone material, are spaced from the top and bottom surfaces of the bottom layer of stone material, are open at and extend between a pair of opposite side portions of the continuous peripheral surface of the bottom layer of stone, and are interrupted by the inner and annular-shaped outer cavities in the annular-shaped middle portion and annular-shaped outer portion of the bottom layer of stone material with the inner layer of copper material and the annular-shaped outer layer of aluminum material respectively embedded therein; and wherein the bottom surface of the top layer of stone material and the top surface of the bottom layer of stone material are adhered to one another at least adjacent to the respective continuous peripheral surfaces thereof.

In another aspect of the present invention, a heat-dissipating cooling pad includes:

a top layer of stone material having spaced apart top and bottom surfaces and a continuous peripheral surface that surrounds and extends between the spaced apart top and bottom surfaces of the top layer of stone material;

a bottom layer of stone material having spaced apart top and bottom surfaces and a continuous peripheral surface that surrounds and extends between the spaced apart top and bottom surfaces of the bottom layer of stone material;

an inner layer of copper material embedded within an inner cavity defined in an annular-shaped middle portion of the bottom layer of stone material, the inner layer of copper material having an upper surface that extends flush with the top surface of the bottom layer of stone material, a lower surface that is spaced apart from and displaced below the upper surface of the inner layer of copper material and above the bottom surface of the bottom layer of stone material, and a continuous peripheral surface that surrounds and extends between the spaced apart upper and lower surfaces of the inner layer of copper material; and an annular-shaped outer layer of aluminum material embedded within an annular-shaped outer cavity defined in an annular-shaped outer portion of the bottom layer of stone material that surrounds and is spaced outwardly from the annular-shaped middle portion of the bottom layer of stone material, the annular-shaped outer layer of aluminum material having an upper surface that extends flush with the top surface of the bottom layer of stone material and the upper surface of the inner layer of copper material, a lower surface that is spaced apart from and displaced below the upper surface of the annular-shaped outer layer of aluminum material and above the bottom surface of the bottom layer of stone material, and spaced apart inner and outer continuous peripheral surfaces that extend between the upper and lower surfaces thereof such that the inner continuous peripheral surface of the annular-shaped outer layer of aluminum material is spaced apart from the continuous peripheral surface of the inner layer of copper material by the annular-shaped middle portion of the bottom layer of stone material and the outer continuous peripheral surface of the annular-shaped outer layer of aluminum material is spaced apart from the continuous peripheral surface of the bottom layer of stone material by the annular-shaped outer portion of the bottom layer of stone material;

wherein the bottom layer of stone material has a plurality of spaced apart perforations that extend through the bottom layer of stone material between the bottom surface of the bottom layer of stone material and a bottom surface of the inner cavity of the bottom layer of stone material in contact with the lower surface of the inner layer of copper material that is embedded within the inner cavity of the annular-shaped middle portion of the bottom layer of stone material; and wherein the bottom surface of the top layer of stone material and the top surface of the bottom layer of stone material are adhered to one another at least adjacent to the respective continuous peripheral surfaces thereof.

These and other aspects, features, and advantages of the present invention will become more readily apparent from the attached drawings and the detailed description of the preferred embodiments, which follow.

BRIEF DESCRIPTION OF THE DRAWINGS

The preferred embodiments of the invention will hereinafter be described in conjunction with the appended drawings provided to illustrate and not to limit the invention, in which.

Like reference numerals refer to like parts throughout the several views of the drawings.

DETAILED DESCRIPTION

Figure 1:
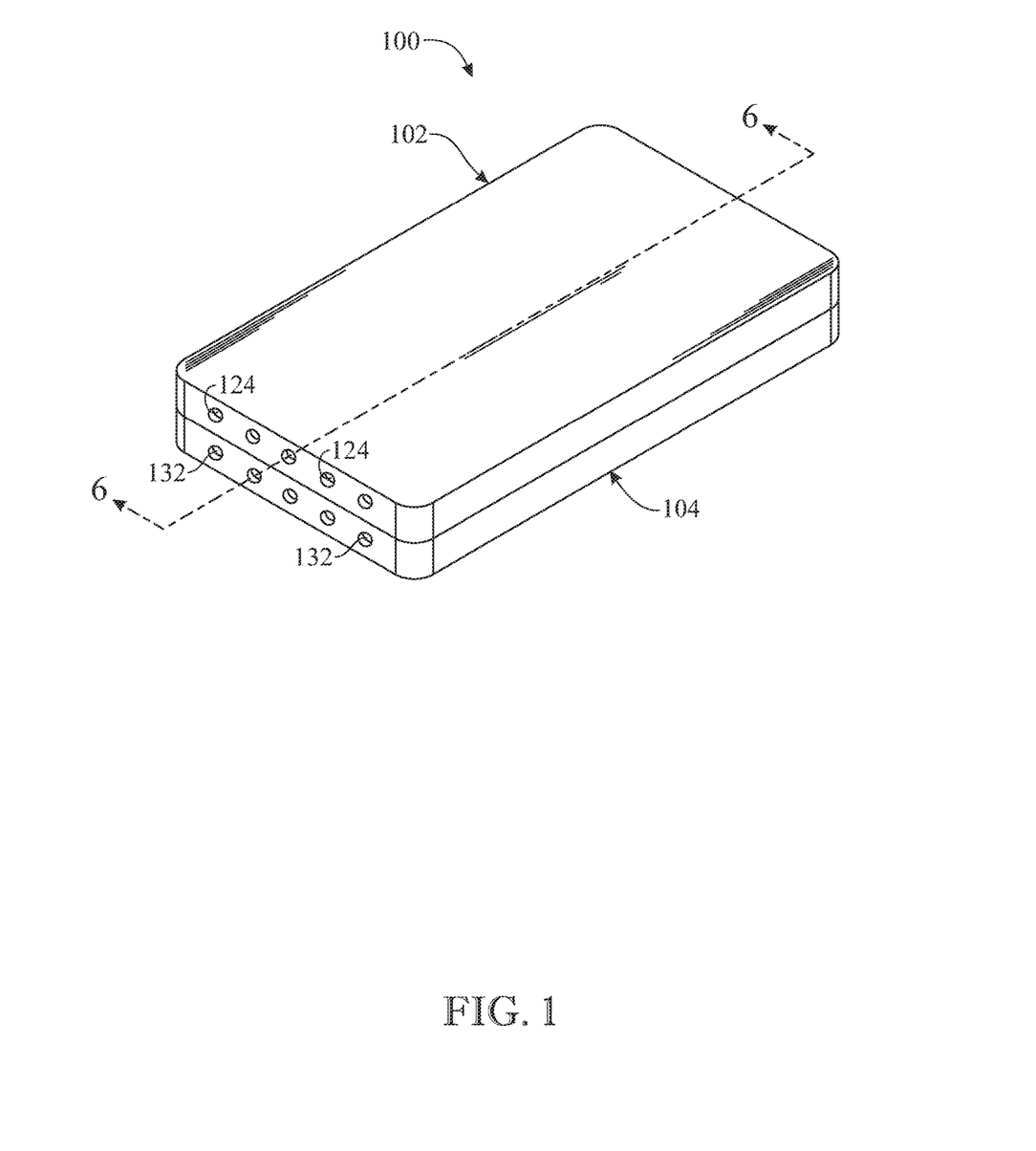
FIG. 1 presents an assembled top isometric view of an exemplary embodiment of a heat-dissipating cooling pad in accordance with aspects of the present invention.
Figure 2:
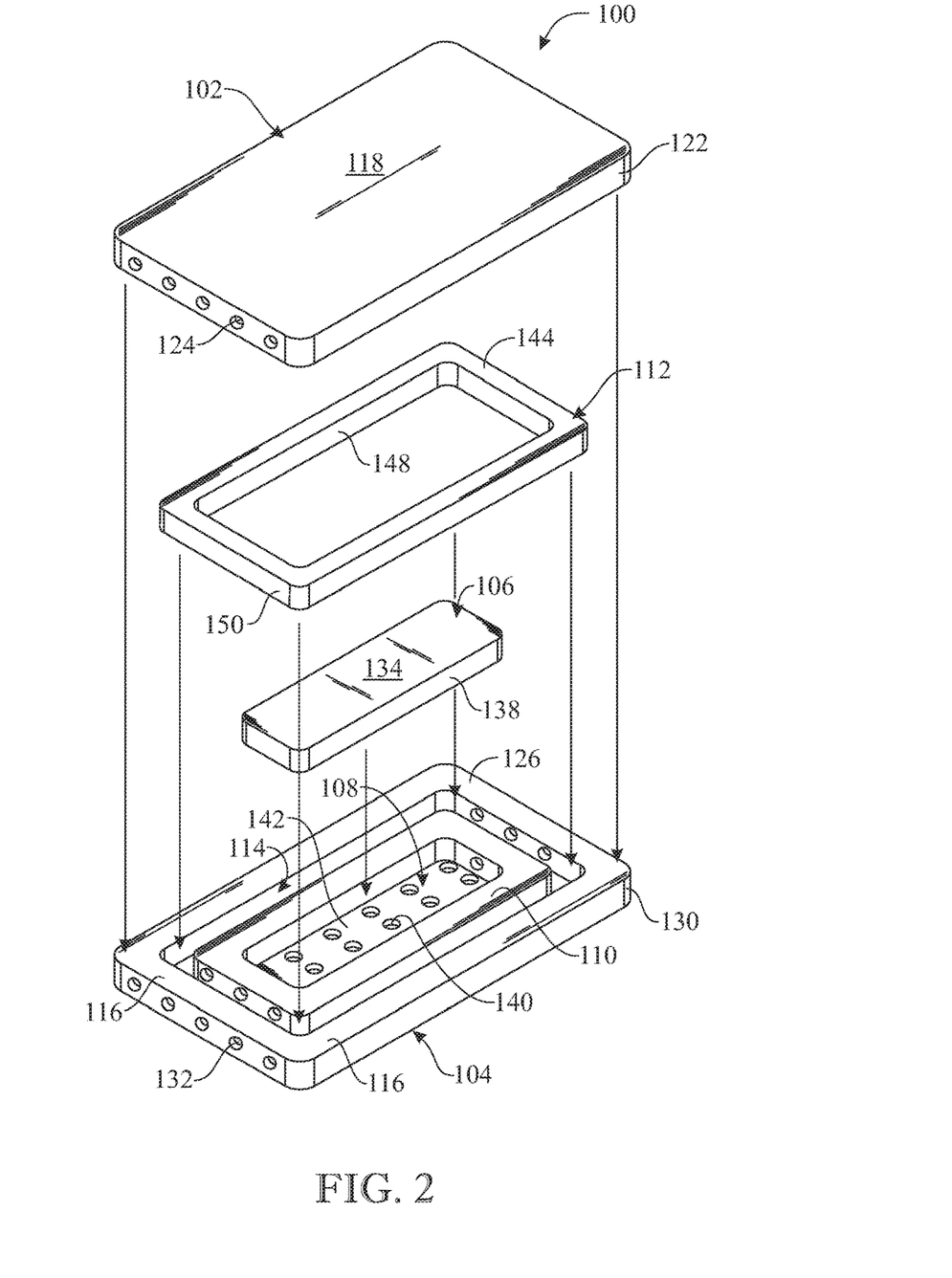
FIG. 2 presents an exploded top isometric view of the heat-dissipating cooling pad originally introduced in FIG. 1.

The following detailed description is merely exemplary in nature and is not intended to limit the described embodiments or the application and uses of the described embodiments. As used herein, the word "exemplary" or "illustrative" means "serving as an example, instance, or illustration." Any implementation described herein as "exemplary" or "illustrative" is not necessarily to be construed as preferred or advantageous over other implementations. All of the implementations described below are exemplary implementations provided to enable persons skilled in the art to make or use the embodiments of the disclosure and are not intended to limit the scope of the disclosure, which is defined by the claims. For purposes of description herein, the terms "upper", "lower", "left", "rear", "right", "front", "vertical", "horizontal", and derivatives thereof shall relate to the invention as oriented in FIGS. 1 and 2. Furthermore, there is no intention to be bound by any expressed or implied theory presented in the preceding technical field, background, brief summary or the following detailed description. It is also to be understood that the specific devices and processes illustrated in the attached drawings, and described in the following specification, are simply exemplary embodiments of the inventive concepts defined in the appended claims. Hence, specific dimensions and other physical characteristics relating to the embodiments disclosed herein are not to be considered as limiting, unless the claims expressly state otherwise.

Referring now to FIGS. 1-3, 5 and 6, there is illustrated an exemplary embodiment of a heat-dissipating cooling pad, generally designated 100, in accordance with aspects of the present invention. The heat-dissipating cooling pad 100 basically includes a top layer 102 of stone material, a bottom layer 104 of stone material, an inner layer 106 of copper material embedded within an inner cavity 108 defined in an annular-shaped middle portion 110 of the bottom layer 104 of stone material, and an annular-shaped outer layer 112 of aluminum material embedded within an annular-shaped outer cavity 114 defined in an annular-shaped outer portion 116 of the bottom layer 104 of stone material that surrounds and is spaced outwardly from the annular-shaped middle portion 110 of the bottom layer 104 of stone material. The top layer 102 of stone material and the bottom layer 104 of stone material are adhered to one another. By way of example but not of limitation, the stone material of the top and bottom layers 102, 104 may be granite or any other suitable stone material. Also, while the top and bottom layers 102, 104 of stone material, the inner layer 106 of copper material and the annular-shaped outer layer 112 of aluminum material are shown having a rectangular configuration, it should be readily understood that they may have other geometric configurations, such as circular, square, etc.

The top layer 102 of stone material of the heat-dissipating cooling pad 100 has spaced-apart top and bottom surfaces 118, 120 and a continuous peripheral surface 122 that surrounds and extends between its spaced apart top and bottom surfaces. The top layer 102 of stone material may have a plurality of spaced apart channels 124 that extends laterally through the top layer of stone material, are spaced from its top and bottom surfaces 118, 120, and are open at and extend between a pair of opposite sides of its continuous peripheral surface 122.

The bottom layer 104 of stone material of the heat-dissipating cooling pad 100 has spaced-apart top and bottom surfaces 126, 128 and a continuous peripheral surface 130 that surrounds and extends between its spaced apart top and bottom surfaces. The top layer 102 of stone material at its bottom surface 120 and the bottom layer 104 of stone material at its top surface 126 are adhered to one another at least adjacent to their respective continuous peripheral surfaces 122, 130.

The bottom layer 104 of stone material may have a plurality of spaced apart channels 132 that extend laterally through the bottom layer of stone material, are spaced from its top and bottom surfaces 126, 128, and are open at and extend between a pair of opposite sides of its continuous peripheral surface 130. The plurality of spaced apart channels 132 are interrupted by the inner and annular-shaped outer cavities 108, 114 in the annular-shaped middle portion 110 and annular-shaped outer portion 116 of the bottom layer 104 of stone material with the inner layer 106 of copper material and the annular-shaped outer layer 112 of copper material respectively embedded therein.

The inner layer 106 of copper material of the heat-dissipating cooling pad 100 has an upper surface 134 that extends flush with the top surface 126 of the bottom layer 104 of stone material. The upper surface 134 of the inner layer 106 of copper material also extends in contact with the bottom surface 120 of the top layer 102 of stone material. The inner layer 106 of copper material also has a lower surface 136 that is spaced apart from and displaced below its upper surface 134 and above the bottom surface 128 of the bottom layer 104 of stone material. The inner layer 106 of copper material further has a continuous peripheral surface 138 that surrounds and extends between its spaced apart upper and lower surfaces 134, 136. The bottom layer 104 of stone material may have a plurality of spaced apart perforations 140 that extend through the bottom layer 104 of stone material between its bottom surface 128 and a bottom surface 142 of its inner cavity 108 in contact with the lower surface 136 of the inner layer 106 of copper material.

The annular-shaped outer layer 112 of aluminum material of the heat-dissipating cooling pad 100 has an upper surface 144 that extends flush with the top surface 126 of the bottom layer 104 of stone material and with the upper surface 134 of the inner layer 106 of copper material. The upper surface 144 of the annular-shaped outer layer 112 of aluminum material also extends in contact with the bottom surface 120 of the top layer 102 of stone material. The annular-shaped outer layer 112 of aluminum material also has a lower surface 146 that is spaced apart from and displaced below its upper surface 144 and above the bottom surface 128 of the bottom layer 104 of stone material. The annular-shaped outer layer 112 of aluminum material further has spaced apart inner and outer continuous peripheral surfaces 148, 150 that extend between its spaced apart upper and lower surfaces 144, 146. The annular-shaped outer layer 112 of aluminum material at its inner continuous peripheral surface 148 and the inner layer 106 of copper material at its continuous peripheral surface 138 are spaced apart from one another by the annular-shaped middle portion 110 of the bottom layer 104 of stone material. The annular-shaped outer layer 112 of aluminum material at its outer continuous peripheral surface 150 and the continuous peripheral surface 130 of the bottom layer 104 of stone material are spaced apart from one another by the annular-shaped outer portion 116 of the bottom layer 104 of stone material.

Figure 3:
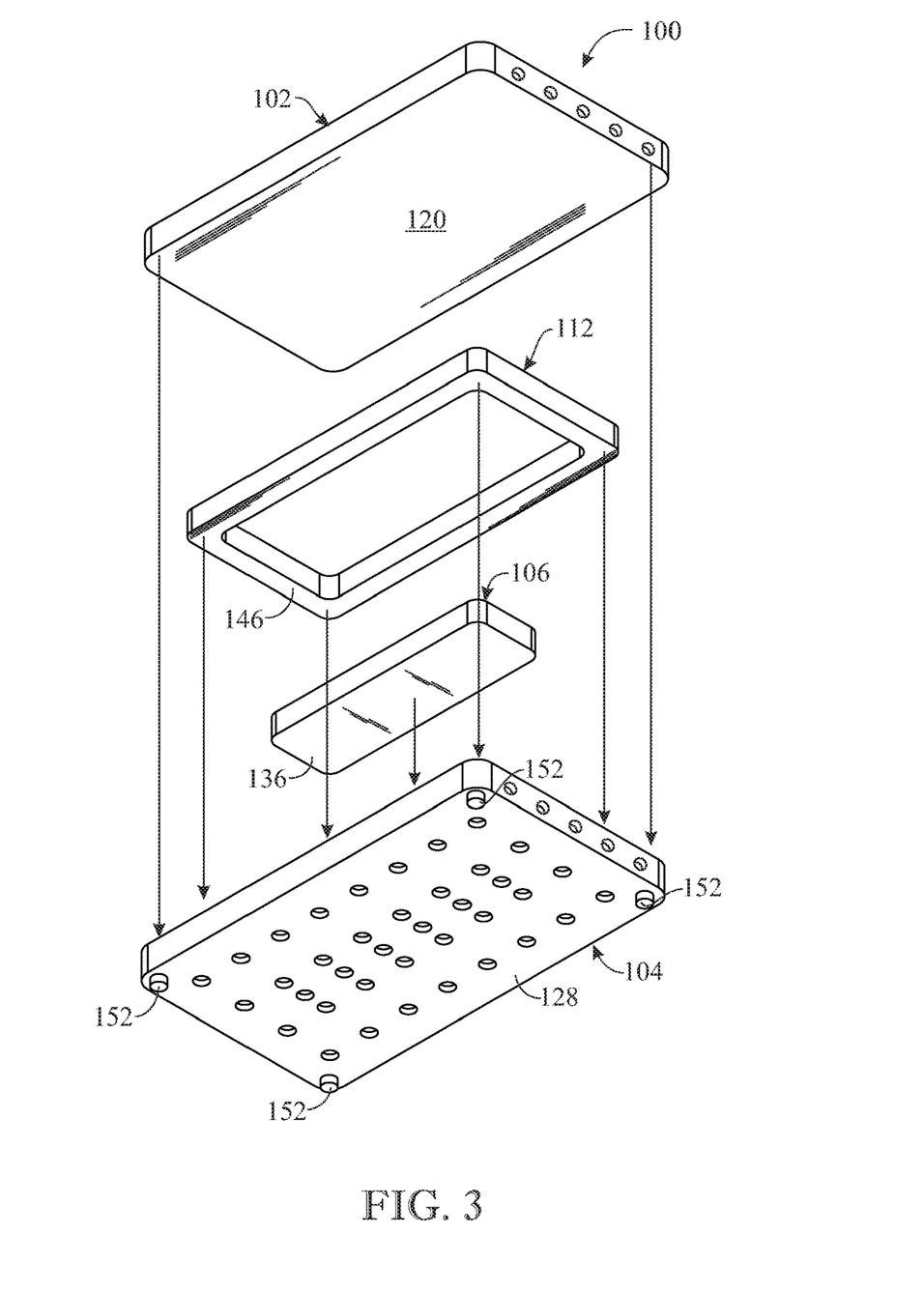
FIG. 3 presents an exploded bottom isometric view of the heat-dissipating cooling pad originally introduced in FIG. 1.
Figure 6:
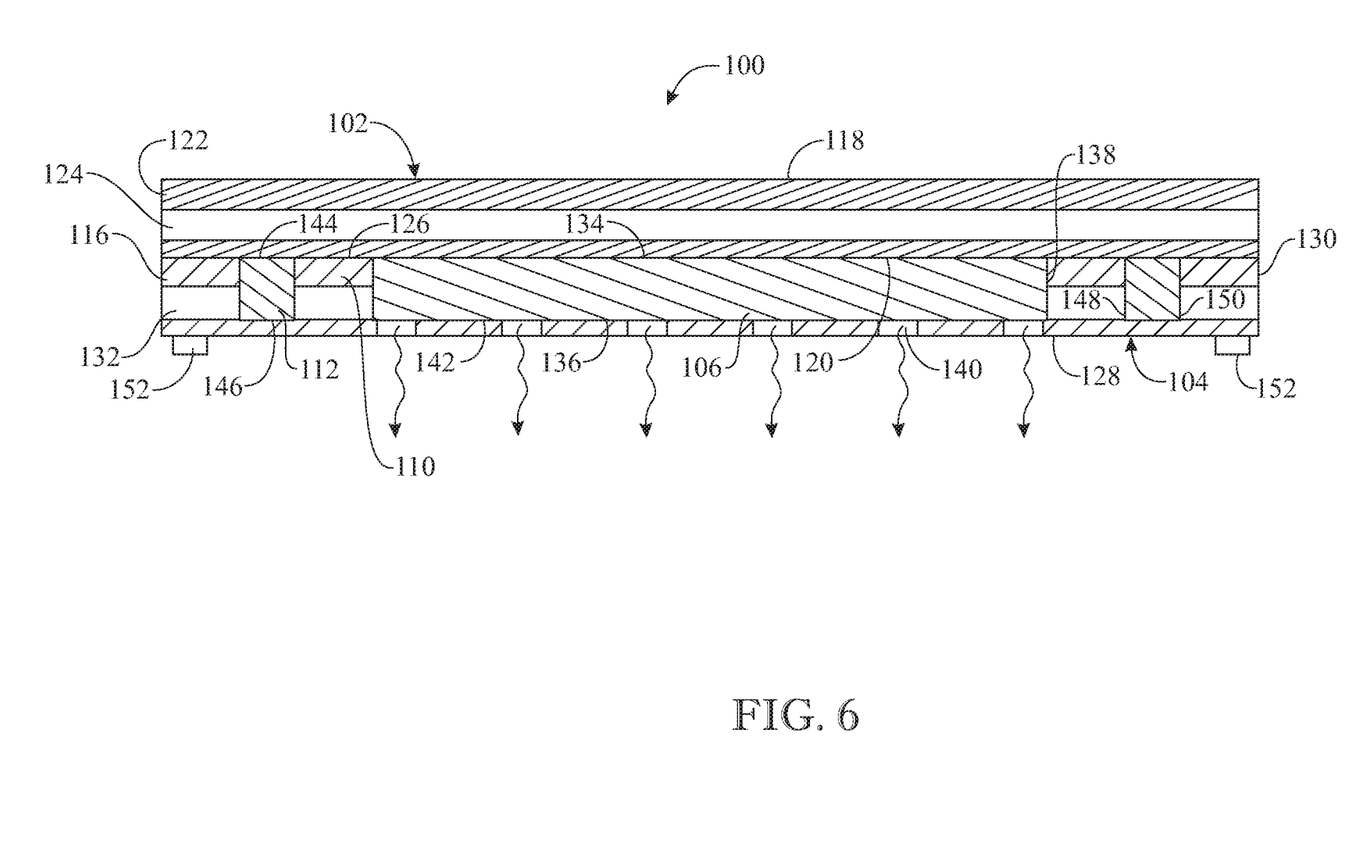
FIG. 6 presents an enlarged longitudinal sectional side view of the heat-dissipating cooling pad as seen along a longitudinal section line 6-6 in FIG. 1.

The heat-dissipating cooling pad 100 also may include a plurality of spaced apart feet 152 attached on the bottom surface 128 of the bottom layer 104 of stone material at spaced apart locations thereon, such as corners of the bottom layer 104, as seen in FIGS. 3 and 6, where the heat-dissipating cooling pad 100 has an overall rectangular configuration. The spaced apart feet 152 support the heat-dissipating cooling pad 100 on a support surface (not shown)

so as to place the bottom layer 104 of stone material in a spaced relationship above the support surface.

Figure 4:
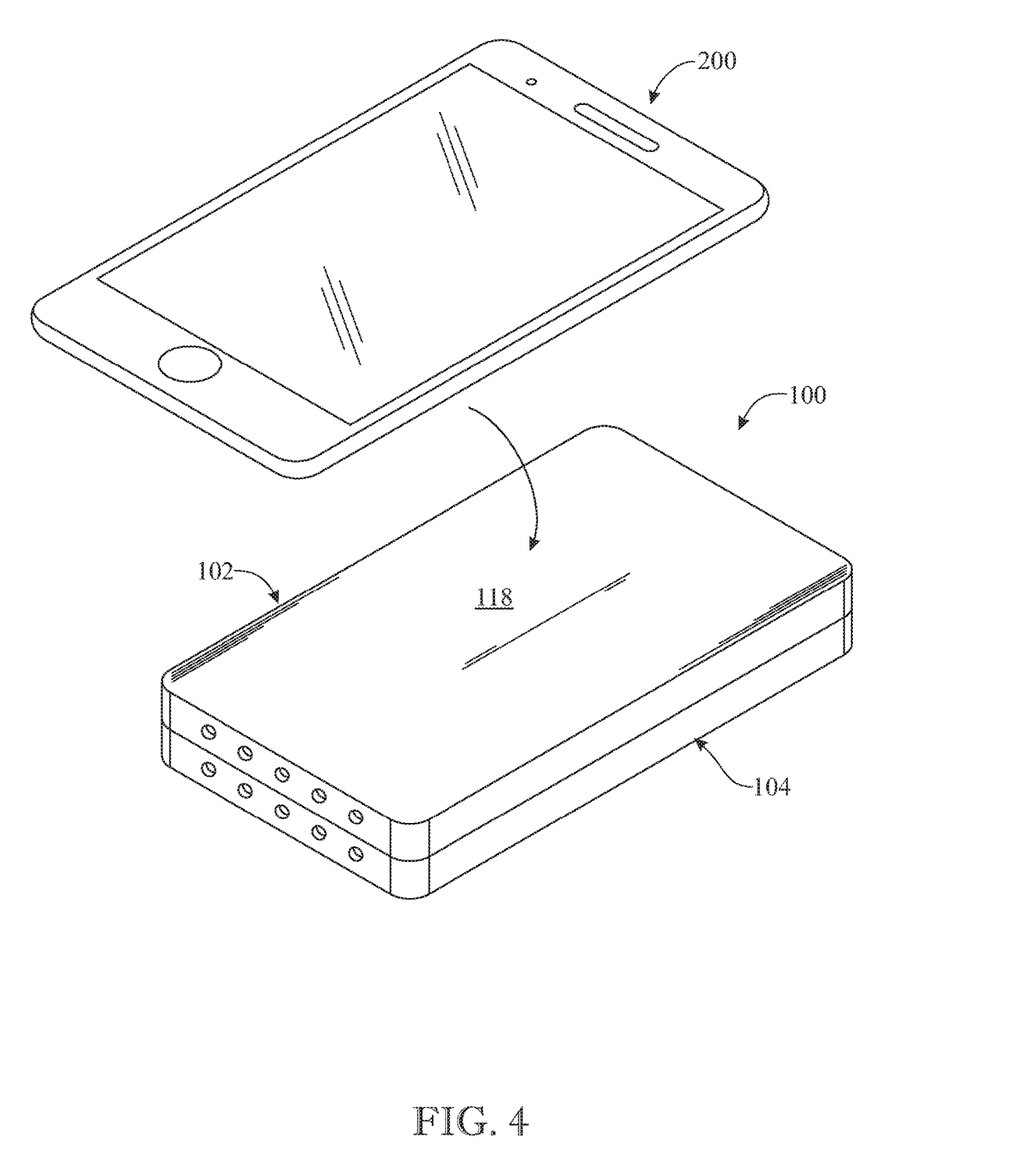
FIG. 4 presents an exploded top isometric view of the heat-dissipating cooling pad originally introduced in FIG. 1, showing a mobile electronic device spaced above and aligned with the top surface of the heat-dissipating cooling pad prior to attached thereto.
Figure 5:
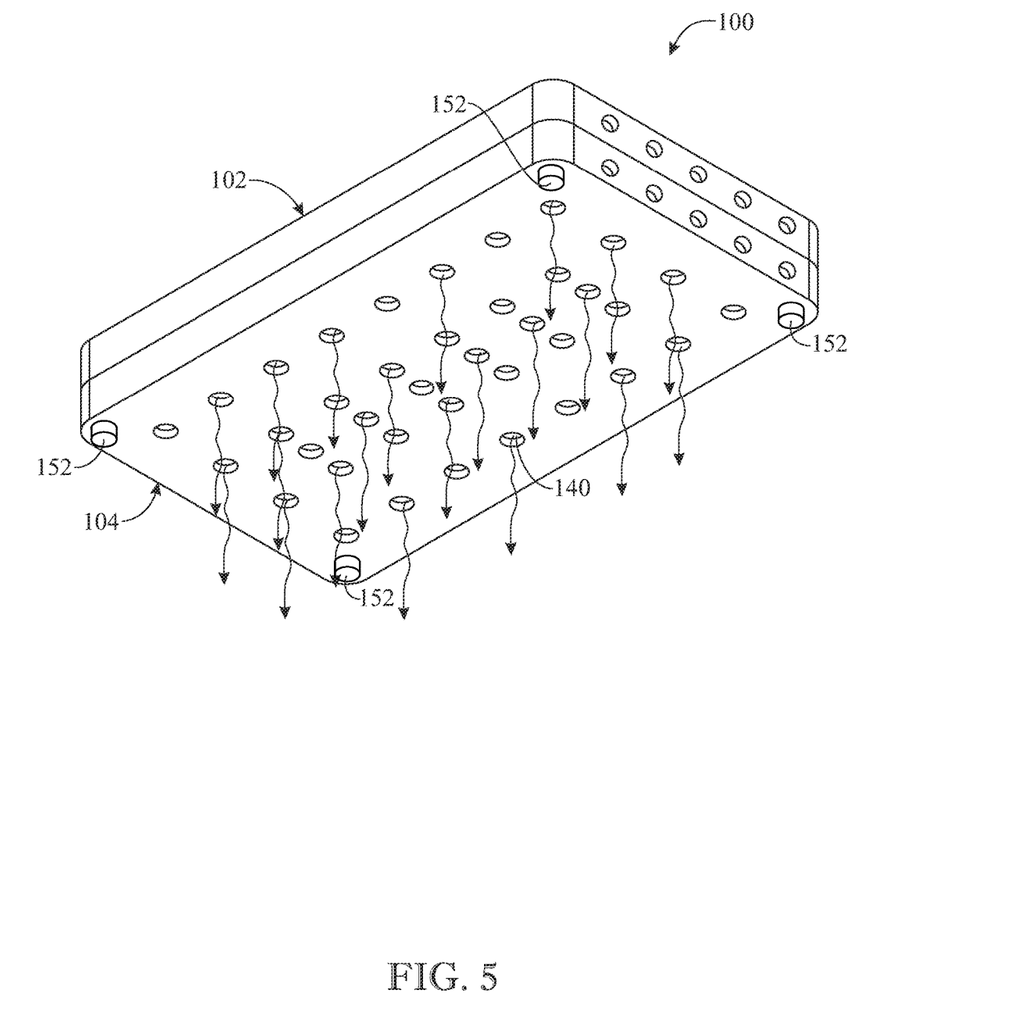
FIG. 5 presents an assembled bottom isometric view of the heat-dissipating cooling pad originally introduced in FIG. 1, illustrating the heat dispersed through holes in the bottom layer of the cooling device.

Referring to FIG. 4, by way of example but not of limitation, there is shown the heat-dissipating cooling pad 100 positioned to receive the back of a mobile electronic device 200, such as a phone or tablet, on the top surface 118 of the top layer 102 of stone material of the cooling pad 100. The heat-dissipating cooling pad 100 may be used in conjunction with a wide variety of heat-generating electronic devices employed in numerous commercial fields. To name just a few examples, the heat-generating electronic devices, which the heat-dissipating cooling pad 100 may be used with, are microprocessors, phones, tablets, laptops, etc., employed in electronic communications, and on cars, trucks, yachts and ships employed in transportation.

Depending upon the particular one of its different uses, the heat-dissipating cooling pad 100 may employ one, both or neither of the pluralities of spaced apart channels 124, 132. Also, the heat-dissipating cooling pad 100 may employ the plurality of spaced apart perforations 140 alone or in combination with one or both of the pluralities of spaced apart channels 124, 132.

The construction of the upper and lower layers 102, 104 from a suitable stone material, such as granite, is believed to improve the heat-dissipating properties of the cooling pad 100 in terms of a more rapid dissipation of heat away from the electronic device. The incorporation of the inner layer 106 of copper material, the outer layer 112 of aluminum material and the pluralities of spaced apart channels 124, 132 and spaced apart perforations 140 is believed to further hasten the dissipation of heat from the surfaces of the stone material such that the exterior surfaces of the cooling pad 100 remain cooler to touch than they would be if the exterior surfaces of the cooling pad 100 were constructed of metal.

The above-described embodiments are merely exemplary illustrations of implementations set forth for a clear understanding of the principles of the invention. Many variations, combinations, modifications or equivalents may be substituted for elements thereof without departing from the scope of the invention. For example, it may be contemplated that the inner layer of the pad be constructed of gold, silver, or any other suitable metals or alloys known to those skilled in the art that will aid in the efficient dissipation of heat. Therefore, it is intended that the invention not be limited to the particular embodiments disclosed as the best mode contemplated for carrying out this invention, but that the invention will include all the embodiments falling within the scope of the appended claims.

What is claimed is:

1. A heat-dissipating cooling pad, comprising:
a top layer of stone material;
a bottom layer of stone material;
an inner layer of copper material embedded within an inner cavity defined in an annular-shaped middle portion of said bottom layer of stone material; and
an annular-shaped outer layer of aluminum material embedded within an annular-shaped outer cavity defined in an annular-shaped outer portion of said bottom layer of stone material that surrounds and is spaced outwardly from said annular-shaped middle portion of said bottom layer of stone material;
wherein said top layer of stone material and said bottom layer of stone material are adhered to one another.

2. The heat-dissipating cooling pad of claim 1 wherein said top layer of stone material has spaced apart top and bottom surfaces and a continuous peripheral surface that surrounds and extends between said spaced apart top and bottom surfaces.

3. The heat-dissipating cooling pad of claim 2 wherein said top layer of stone material has a plurality of spaced apart channels that extend laterally through said top layer of stone material, are spaced from said top and bottom surfaces of said top layer of stone material, and are open at and extend between a pair of opposite sides of said continuous peripheral surface of said top layer of stone.

4. The heat-dissipating cooling pad of claim 2 wherein said inner layer of copper material and said annular-shaped outer layer of aluminum material have respective upper surfaces that extend in contact with said bottom surface of said top layer of stone material.

5. The heat-dissipating cooling pad of claim 1 wherein said bottom layer of stone material has spaced apart top and bottom surfaces and a continuous peripheral surface that surrounds and extends between said spaced apart top and bottom surfaces.

6. The heat-dissipating cooling pad of claim 5 wherein said inner layer of copper material and said annular-shaped outer layer of aluminum material have respective upper surfaces that extend flush with said top surface of said bottom layer of stone material.

7. The head-dissipating cooling pad of claim 6 wherein said inner layer of copper material and said annular-shaped outer layer of aluminum material have respective lower surfaces that are spaced apart from and displaced below said respective upper surfaces thereof and above said bottom surface of said bottom layer of stone material.

8. The heat-dissipating cooling pad of claim 7 wherein said inner layer of copper material has a continuous peripheral surface that surrounds and extends between said upper and lower surfaces thereof and said annular-shaped outer layer of aluminum material has spaced apart inner and outer continuous peripheral surfaces that extend between said upper and lower surfaces thereof such that said inner continuous peripheral surface of said annular-shaped outer layer of aluminum material and said continuous peripheral surface of said inner layer of copper material are spaced apart from one another by said annular-shaped middle portion of said bottom layer of stone material and said outer continuous peripheral surface of said annular-shaped outer layer of aluminum material and said continuous peripheral surface of said bottom layer of stone material are spaced apart from one another by said annular-shaped outer portion of said bottom layer of stone material.

9. The heat-dissipating cooling pad of claim 5 wherein said bottom layer of stone material has a plurality of spaced apart channels that extend laterally through said bottom layer of stone material, are spaced from said top and bottom surfaces of said bottom layer of stone material, are open at and extend between a pair of opposite sides of said continuous peripheral surface of said bottom layer of stone material, and are interrupted by said inner and annular-shaped outer cavities in said annular-shaped middle portion and annular-shaped outer portion of said bottom layer of stone material with said inner layer of copper material and said annular-shaped outer layer of copper material respectively embedded therein.

10. The heat-dissipating cooling pad of claim 1 wherein said bottom layer of stone material has a plurality of spaced apart perforations that extend through said bottom layer of stone material and between said bottom surface of said bottom layer of stone material and a bottom surface of said inner cavity of said bottom layer of stone material in contact with said lower surface of said inner layer of copper material that is embedded within said inner cavity of said annular-shaped middle portion of said bottom layer of stone material.

11. The heat-dissipating cooling pad of claim 1 wherein said stone material of said top and bottom layers is granite.

12. The heat-dissipating cooling pad of claim 1 further comprising:
a plurality of feet attached on said bottom surface of said bottom layer of stone material at spaced apart locations thereon to support said cooling pad on a support surface so as to place said bottom layer of stone material in a spaced relation above the support surface.

13. A heat-dissipating cooling pad, comprising:
a top layer of stone material having spaced apart top and bottom surfaces and a continuous peripheral surface that surrounds and extends between said spaced apart top and bottom surfaces;
a bottom layer of stone material having spaced apart top and bottom surfaces and a continuous peripheral surface that surrounds and extends between said spaced apart top and bottom surfaces;
an inner layer of copper material embedded within an inner cavity defined in an annular-shaped middle portion of said bottom layer of stone material, said inner layer of copper material having an upper surface that extends flush with said top surface of said bottom layer of stone material, a lower surface that is spaced apart from and displaced below said upper surface of said inner layer of copper material and above said bottom surface of said bottom layer of stone material, and a continuous peripheral surface that surrounds and extends between said spaced apart upper and lower surfaces of said inner layer of copper material; and
an annular-shaped outer layer of aluminum material embedded within an annular-shaped outer cavity defined in an annular-shaped outer portion of said bottom layer of stone material that surrounds and is spaced outwardly from said annular-shaped middle portion of said bottom layer of stone material, said annular-shaped outer layer of aluminum material having an upper surface that extends flush with said top surface of said bottom layer of stone material and said upper surface of said inner layer of copper material, a lower surface that is spaced apart from and displaced below said upper surface of said annular-shaped outer layer of aluminum material and above said bottom surface of said bottom layer of stone material, and spaced apart inner and outer continuous peripheral surfaces that extend between said upper and lower surfaces thereof such that said inner continuous peripheral surface of said annular-shaped outer layer of aluminum material is spaced apart from said continuous peripheral surface of said inner layer of copper material by said annular-shaped middle portion of said bottom layer of stone material and said outer continuous peripheral surface of said annular-shaped outer layer of aluminum material is spaced apart from said continuous peripheral surface of said bottom layer of stone material by said annular-shaped outer portion of said bottom layer of stone material;
wherein said top layer of stone material has a plurality of spaced apart channels that extend laterally through said top layer of stone material, are spaced from said top and bottom surfaces of said top layer of stone material, and are open at and extend between a pair of opposite side portions of said continuous peripheral surface of said top layer of stone;
wherein said bottom layer of stone material has a plurality of spaced apart channels that extend laterally through said bottom layer of stone material, are spaced from said top and bottom surfaces of said bottom layer of stone material, are open at and extend between a pair of opposite side portions of said continuous peripheral surface of said bottom layer of stone, and are interrupted by said inner and annular-shaped outer cavities in said annular-shaped middle portion and said annular-shaped outer portion of said bottom layer of stone material with said inner layer of copper material and said annular-shaped outer layer of aluminum material respectively embedded therein; and
wherein said bottom surface of said top layer of stone material and said top surface of said bottom layer of stone material are adhered to one another at least adjacent to said respective continuous peripheral surfaces thereof.

14. The heat-dissipating cooling pad of claim 13 wherein said upper surface of said inner layer of copper material and said upper surface of said annular-shaped outer layer of aluminum material extend in contact with said bottom surface of said top layer of stone material.

15. The heat-dissipating cooling pad of claim 13 wherein said stone material of said top and bottom layers is granite.

16. The heat-dissipating cooling pad of claim 13 further comprising: a plurality of feet attached on said bottom surface of said bottom layer of stone material at spaced apart locations thereon to support said cooling pad on a support surface and to place said bottom layer of stone material in a spaced relation above the support surface.

17. A heat-dissipating cooling pad, comprising:
a top layer of stone material having spaced apart top and bottom surfaces and a continuous peripheral surface that surrounds and extends between said spaced apart top and bottom surfaces of said top layer of stone material;
a bottom layer of stone material having spaced apart top and bottom surfaces and a continuous peripheral surface that surrounds and extends between said spaced apart top and bottom surfaces of said bottom layer of stone material;
an inner layer of copper material embedded within an inner cavity defined in an annular-shaped middle portion of said bottom layer of stone material, said inner layer of copper material having an upper surface that extends flush with said top surface of said bottom layer of stone material, a lower surface that is spaced apart from and displaced below said upper surface of said inner layer of copper material and above said bottom surface of said bottom layer of stone material, and a continuous peripheral surface that surrounds and extends between said spaced apart upper and lower surfaces of said inner layer of copper material; and
an annular-shaped outer layer of aluminum material embedded within an annular-shaped outer cavity defined in an annular-shaped outer portion of said bottom layer of stone material that surrounds and is spaced outwardly from said annular-shaped middle portion of said bottom layer of stone material, said annular-shaped outer layer of aluminum material having an upper surface that extends flush with said top surface of said bottom layer of stone material and said upper surface of said inner layer of copper material, a lower surface that is spaced apart from and displaced below said upper surface of said annular-shaped outer layer of aluminum material and above said bottom surface of said bottom layer of stone material, and spaced apart inner and outer continuous peripheral surfaces that extend between said upper and lower surfaces of said annular-shaped outer layer of aluminum material such that said inner continuous peripheral surface of said annular-shaped outer layer of aluminum material is spaced apart from said continuous peripheral surface of said inner layer of copper material by said annular-shaped middle portion of said bottom layer of stone material and said outer continuous peripheral surface of said annular-shaped outer layer of aluminum material is spaced apart from said continuous peripheral surface of said bottom layer of stone material by said annular-shaped outer portion of said bottom layer of stone material;

wherein said bottom layer of stone material has a plurality of spaced apart perforations that extend through said bottom layer of stone material between said bottom surface of said bottom layer of stone material and a bottom surface of said inner cavity of said bottom layer of stone material that is in contact with said lower surface of said inner layer of copper material embedded within said inner cavity of said annular-shaped middle portion of said bottom layer of stone material; and wherein said bottom surface of said top layer of stone material and said top surface of said bottom layer of stone material are adhered to one another at least adjacent to said respective continuous peripheral surfaces thereof.

18. The heat-dissipating cooling pad of claim 17 wherein said stone material of said top and bottom layers is granite.

19. The heat-dissipating cooling pad of claim 17 further comprising: a plurality of feet attached on said bottom surface of said bottom layer of stone material at spaced apart locations thereon to support said cooling pad on a support surface and to place said bottom layer of stone material in a spaced relation above the support surface.

* * * * *